United States Patent
Himmelbauer et al.

(10) Patent No.: US 9,223,332 B1
(45) Date of Patent: Dec. 29, 2015

(54) STABILIZING REFERENCE VOLTAGE OF SWITCHED CAPACITOR CIRCUITS

(71) Applicant: Maxim Integrated Products, Inc., San Jose, CA (US)

(72) Inventors: Wolfgang Himmelbauer, Palo Alto, CA (US); Jonathan Strode, Los Altos, CA (US); Larry Skrenes, Hartland, WI (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 14/202,367

(22) Filed: Mar. 10, 2014

Related U.S. Application Data (60) Provisional application No. 61/875,791, filed on Sep. 10, 2013.

(51) Int. Cl.
| | |
|---|---|
| *H03M 1/66* | (2006.01) |
| *G05F 3/02* | (2006.01) |
| *G05F 1/10* | (2006.01) |
| *H03M 1/12* | (2006.01) |

(52) U.S. Cl.
CPC .. *G05F 3/02* (2013.01); *G05F 1/10* (2013.01); *H03M 1/12* (2013.01); *H03M 1/66* (2013.01)

(58) Field of Classification Search
CPC ............. H03M 1/66; H03M 1/12; G05F 1/10; G05F 3/02
USPC .......... 341/150, 144, 155, 118, 120, 161, 172
See application file for complete search history.

(56) References Cited

U.S. PATENT DOCUMENTS

| | | | |
|---|---|---|---|
| 6,314,028 B1 * | 11/2001 | Kono ........................ | 365/189.09 |
| 6,614,313 B2 * | 9/2003 | Crofts et al. .................. | 331/1 R |
| 6,869,216 B1 * | 3/2005 | Holloway et al. ............. | 374/170 |
| 7,159,583 B2 * | 1/2007 | Beyler et al. .................. | 123/644 |
| 7,605,579 B2 * | 10/2009 | Betser et al. ................ | 324/76.11 |
| 8,436,677 B2 * | 5/2013 | Kull et al. ..................... | 327/541 |
| 8,830,097 B2 * | 9/2014 | Aruga et al. .................. | 341/143 |

* cited by examiner

*Primary Examiner* — Peguy Jean Pierre (57) ABSTRACT

A system includes a switched capacitor circuit and a stabilizing circuit. The switched capacitor circuit receives a reference voltage from a reference node, transitions from a first state to a second state, and draws or supplies a switched capacitor charge from or to the reference node in response to transitioning from the first state to the second state. The second state is a function of the first state, an input of the switched capacitor circuit, or a combination of both. The stabilizing circuit stabilizes the reference voltage by supplying or drawing a stabilizing charge to or from the reference node based on the first and second states of the switched capacitor circuit.

12 Claims, 11 Drawing Sheets

STABILIZING REFERENCE VOLTAGE OF SWITCHED CAPACITOR CIRCUITS

CROSS-REFERENCE TO RELATED APPLICATIONS

This application claims the benefit of U.S. Provisional Application No. 61/875,791, filed on Sep. 10, 2013. The entire disclosure of the application referenced above is incorporated herein by reference.

FIELD

The present disclosure relates to systems and methods for stabilizing reference voltage of switched capacitor circuits.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A switched capacitor includes a network of a plurality of capacitors and switches, where the capacitors and the switches are connected in series, parallel, or a combination of both. The capacitors are charged and discharged by selectively opening and closing the switches. Switched capacitor circuits are used in many systems such as amplifiers, integrators, differentiators, adders, filters, comparators, data converters such as digital-to-analog converters (DACs) and analog-to-digital converters (ADCs), and so on. An example of a switched capacitor circuit is a switched capacitor DAC (capacitive DAC). Such a DAC may be stand-alone or embedded in a successive-approximation-register (SAR) ADC or a pipelined ADC. Switched capacitor based modulator circuits are also used in Sigma-Delta ADCs.

Cyclic or algorithmic analog-to-digital converters (ADCs) such as successive-approximation-register (SAR) ADCs, Sigma-Delta ADCs, and pipelined ADCs use a capacitive DAC as a core building block. For example, in a SAR ADC, during a conversion process, a capacitive DAC is periodically switched to generate analog voltage levels for comparison with a sampled input signal as part of a successive approximation algorithm. Specifically, inputs of the capacitive DAC are successively switched to either a reference voltage $V_{REF}$ or ground, thereby demanding charge from the reference voltage $V_{REF}$. The amount of charge drawn by the capacitive DAC from the reference voltage depends on the input signal (i.e., input voltage) and is a function of a result or code generated by the conversion process. Accordingly, the capacitive DAC represents a code-dependent load that draws a code-dependent load current from the reference voltage.

SUMMARY

A system comprises a switched capacitor circuit and a stabilizing circuit. The switched capacitor circuit receives a reference voltage from a reference node, transitions from a first state to a second state, and draws or supplies a switched capacitor charge from or to the reference node in response to transitioning from the first state to the second state. The second state is a function of the first state, an input of the switched capacitor circuit, or a combination of both. The stabilizing circuit stabilizes the reference voltage by supplying or drawing a stabilizing charge to or from the reference node based on the first and second states of the switched capacitor circuit.

In another feature, the switched capacitor charge and the stabilizing charge are a function of the first and second states.

In another feature, a sum of the switched capacitor charge and the stabilizing charge is independent of the first and second states.

In other features, the system further comprises a feedback circuit and a buffer. The feedback circuit is connected to the reference node and generates a feedback of the reference voltage. The buffer receives the feedback and a first voltage and supplies a buffer charge to the reference node. The buffer charge compensates for a positive or negative error in estimation of the stabilizing charge.

In other features, the system further comprises a feedback circuit and a buffer. The feedback circuit is connected to the reference node and generates a feedback of the reference voltage. The buffer receives the feedback and a first voltage and supplies a buffer charge to the reference node. The buffer charge is independent of the first and second states and replenishes any charge in a capacitance connected to the reference node that is depleted due to a sum of the switched capacitor charge and the stabilizing charge drawn from the capacitance.

In other features, the system further comprises a feedback circuit and a buffer. The feedback circuit is connected to the reference node and generates a feedback of the reference voltage. The buffer receives the feedback and a first voltage and supplies a buffer charge to the reference node. The buffer charge is equal to a sum of the switched capacitor charge and the stabilizing charge.

In another feature, a digital-to-analog converter comprises the system.

In another feature, an analog-to-digital converter comprises the system.

In still other features, a method comprises receiving a reference voltage at a switched capacitor circuit from a reference node. The method further comprises drawing or supplying a switched capacitor charge from or to the reference node in response to the switched capacitor circuit transitioning from a first state to a second state. The second state is a function of the first state, an input of the switched capacitor circuit, or a combination of both. The method further comprises stabilizing the reference voltage by supplying or drawing a stabilizing charge from or to the reference node based on the first and second states of the switched capacitor circuit.

In another feature, the switched capacitor charge and the stabilizing charge are a function of the first and second states.

In another feature, a sum of the switched capacitor charge and the stabilizing charge is independent of the first and second states.

In other features, the method further comprises generating a feedback of the reference voltage, supplying a buffer charge to the reference node based on the feedback and a first voltage, and compensating for a positive or negative error in estimation of the stabilizing charge using the buffer charge.

In other features, the method further comprises generating a feedback of the reference voltage, and supplying a buffer charge to the reference node based on the feedback and a first voltage. The buffer charge is independent of the first and second states. The method further comprises replenishing using the buffer charge any charge in a capacitance connected to the reference node that is depleted due to a sum of the switched capacitor charge and the stabilizing charge drawn from the capacitance.

In other features, the method further comprises generating a feedback of the reference voltage, and supplying a buffer charge to the reference node based on the feedback and a first voltage. The buffer charge is equal to a sum of the switched capacitor charge and the stabilizing charge.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 9A depicts a switched capacitor circuit that receives an analog input, a digital input, or both, and that generates an output that is fed back to the switched capacitor circuit according to the present disclosure.

In the drawings, reference numbers may be reused to identify similar and/or identical elements.

DETAILED DESCRIPTION

The present disclosure relates to systems and methods for stabilizing the reference voltage by making a charge supplied or drawn by a stabilizing circuit (stabilizing charge) equal and opposite to a charge drawn or supplied by a switched capacitor circuit (switched capacitor charge). In other words, the reference voltage is stabilized by making a sum of the switched capacitor charge and the stabilizing charge independent of the state transitions of the switched capacitor circuit.

The present disclosure is organized as follows. Initially, stabilizing the reference voltage is explained using a capacitive DAC as an example of a switched capacitor circuit with reference to FIGS. 1-6. Thereafter, stabilizing the reference voltage of a general switched capacitor circuit is described with reference to FIGS. 7A-9B. Throughout the present disclosure, the capacitive DAC is shown as embedded in an ADC. It should be understood, however, that the teachings of the present disclosure are equally applicable to standalone capacitive DACs and to circuits and systems other than DACs and ADCs that use switched capacitor circuits.

Switched capacitor circuits are used in many systems. For example, a capacitive digital-to-analog converter (DAC) uses a switched capacitor circuit. In analog-to-digital converters (ADCs) employing a capacitive digital-to-analog converter (DAC) for conversion, the accuracy of the conversion depends on the stability of the reference voltage supplied to the capacitive DAC. Typically, the amount of charge drawn by the capacitive DAC from the reference voltage depends on input voltage being converted to a digital code and is a function of the code generated by the conversion. A code-dependent load current drawn by the capacitive DAC from the source supplying the reference voltage may create code-dependent voltage fluctuations in the reference voltage, which can degrade the linearity of the ADC.

In ADC's using a capacitive DAC, the reference voltage supplied to the capacitive DAC can be stabilized and the load current drawn by the capacitive DAC from the source supplying the reference voltage can be made code-independent (i.e., input-voltage independent). The amount of charge drawn by the capacitive DAC can be estimated by analyzing an internal state of the ADC or the output of the ADC. The internal state of the ADC is the raw conversion data generated by a conversion stage of the ADC (e.g., contents of a SAR register). The raw conversion data is processed (e.g., corrected, decimated, etc.) by an output stage of the ADC to provide the output of the ADC. The estimated charge can be injected into the reference input of the capacitive DAC to eliminate the net charge demand from a charge reservoir (e.g., a reference capacitor connected to the reference voltage and ground). Alternatively, a reference buffer can be used to monitor the reference voltage, and based on the estimated charge, charge can be drawn from the charge reservoir to eliminate code-dependence of the charge drawn from the reference buffer.

Specifically, the charge drawn from the source supplying the reference voltage during conversion can be estimated by monitoring the internal state of the ADC (e.g., contents of a SAR register). A charge adjusting circuit can process the internal state of the ADC (e.g., contents of a SAR register) and generate the estimated charge using a supply that is different than the source supplying the reference voltage and for which variations in load are unimportant. The charge adjusting circuit can inject the estimated charge into a reference node to which the reference voltage, the reference capacitor, an output of the charge adjusting circuit, and the reference input of the ADC are connected. Injecting the charge into the reference node in this manner nulls out the net charge demand from the source generating the reference voltage or the charge reservoir. The code-dependence of the net charge drawn from the source or the charge reservoir can thus be eliminated.

Alternatively, the charge adjusting circuit can process the internal state of the ADC (e.g., contents of a SAR register) and draw a charge from the reference node such that a sum of the reference load current demanded by the ADC and the charge drawn from the reference node by the charge adjusting circuit remains constant during the conversion. Drawing the charge from the reference node in this manner eliminates code-dependence of the load current and presents a constant load to an active circuit such as a reference buffer that drives the reference node. This relaxes the power, settling, gain, and output impedance requirements of the reference buffer. If the reference buffer is integrated on-chip (i.e., with the ADC), the design complexity, design time, and die area are reduced. If the reference buffer is off-chip, the need for a high-performance reference buffer can be eliminated, and the reference node can be driven directly by a source supplying the reference voltage, thereby lowering system cost, power, and printed circuit board space. Additionally, crosstalk between multiple ADCs when using a single reference buffer is reduced.

Figure 1:
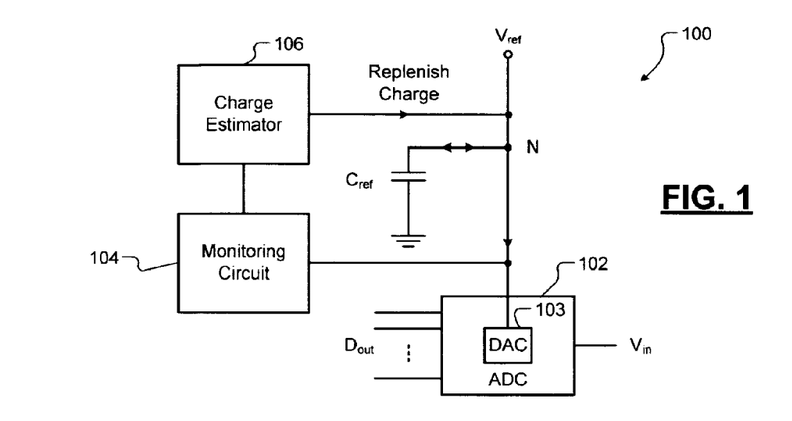
FIG. 1 depicts a system for converting an analog input into a digital output using a charge estimator.

Referring now to FIG. 1, a system 100 for converting an analog input into a digital output includes an ADC 102, a monitoring circuit 104, and a charge estimator 106. The ADC 102 converts an analog input voltage $V_{in}$ into a digital output $D_{out}$ using a reference voltage $V_{ref}$. For example, the ADC 102 may include a SAR ADC that uses a capacitive DAC 103 that generates analog voltage levels for successive approximation of the input voltage $V_{in}$. A node N to which the reference voltage is connected is called a reference node.

Due to successive switching, the capacitive DAC 103 demands dynamic charge from the reference node. A bypass capacitor $C_{ref}$ connected to the reference node acts as a charge reservoir. The bypass capacitor $C_{ref}$ supplies instantaneous dynamic charge to the capacitive DAC 103 of the ADC 102. Over time, the charge in the charge reservoir gets depleted due to the charge drawn by the capacitive DAC 103 of the ADC 102 and needs to be replenished. To stabilize the reference voltage $V_{ref}$, the monitoring circuit 104 monitors the reference voltage $V_{ref}$, and based on the monitoring, the charge estimator 106 supplies a replenish charge to replenish the charge in the charge reservoir that has been depleted by the capacitive DAC 103 of the ADC 102.

Figure 2:
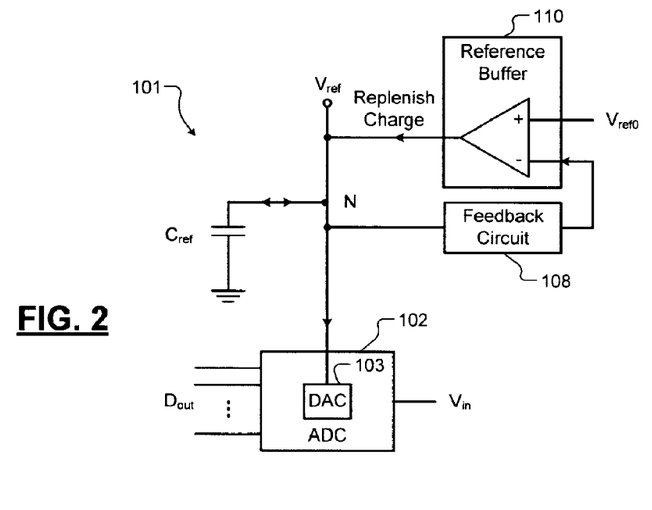
FIG. 2 depicts a system for converting an analog input into a digital output using a reference buffer as a charge estimator.

Referring now to FIG. 2, a system 101 for converting an analog input into a digital output includes the ADC 102, a feedback circuit 108, and a reference buffer 110. The feedback circuit 108 and the reference buffer 110 represent an example of the charge estimator 106. The feedback circuit 108 monitors the reference voltage $V_{ref}$ and generates a feedback of the reference voltage $V_{ref}$. The reference buffer 110 receives the feedback and compares the feedback to a voltage $V_{ref0}$. Based on the comparison, the reference buffer 110 injects a replenish charge into the reference node to eliminate any difference between the reference voltage $V_{ref}$ and the voltage $V_{ref0}$ (if the feedback circuit 108 has a unity gain), thereby effectively replenishing the charge reservoir ($C_{ref}$). Since the charge demanded by the capacitive DAC 103 of the ADC 102 is code- (or input voltage-) dependent, the reference voltage $V_{ref}$ is subject to voltage fluctuations due to non-ideal characteristics (e.g., finite output impedance) of the reference buffer 110. Fluctuations in the reference voltage $V_{ref}$ can degrade the accuracy of the ADC 102.

Figure 3A:
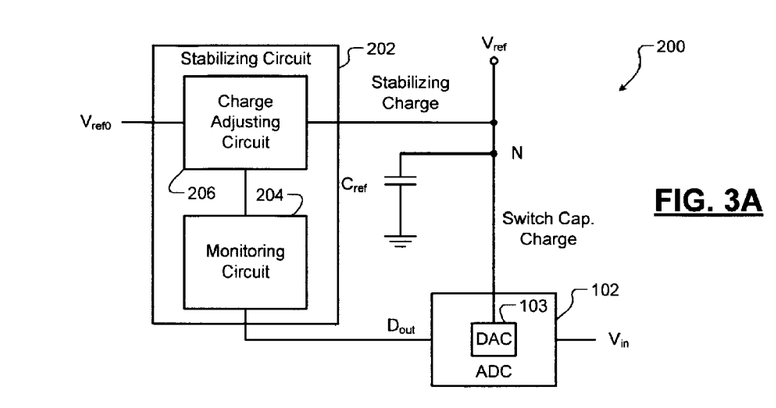
FIGS. 3A-3C depict a system for converting an analog input into a digital output using a stabilizing circuit to stabilize a reference voltage according to the present disclosure.
Figure 3B:
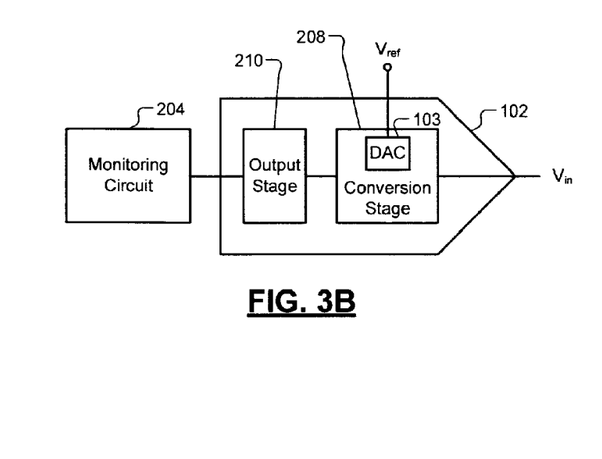
Figure 3C:
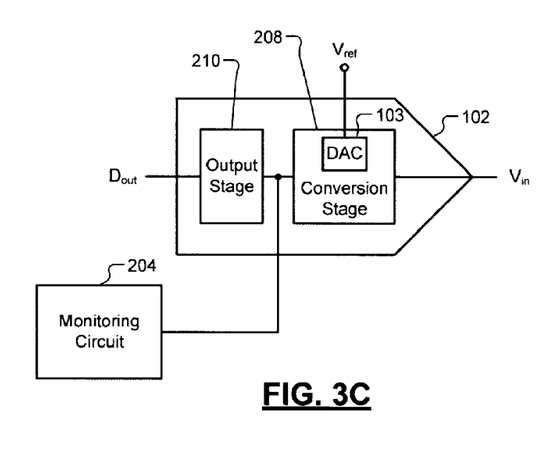

Referring now to FIGS. 3A-3C, a system 200 for stabilizing the reference voltage when converting an analog input into a digital output according to the present disclosure is shown. The system 200 includes the ADC 102 and a stabilizing circuit 202. In FIG. 3A, the stabilizing circuit 202 includes a monitoring circuit 204 and a charge adjusting circuit 206. The monitoring circuit 204 monitors the internal state of the ADC 102 in one of two ways as shown in FIGS. 3B and 3C.

In FIGS. 3B and 3C, the ADC 102 includes a conversion stage 208 and an output stage 210. The conversion stage 208 includes the capacitive DAC 103 that converts the input voltage $V_{in}$ into raw digital data, which can be called an internal state of the capacitive DAC 103 or the ADC 102. The output stage 210 processes the raw digital data and generates the output of the ADC 102, is a digital representation of the input voltage $V_{in}$.

For example, in a SAR ADC, the raw digital data may be the contents of the SAR register. For example, the processing performed by the output stage 210 may include correcting, decimating, synchronizing, buffering, and/or filtering and so on of the raw digital data. The monitoring circuit 204 can determine the internal state of the ADC 102 based on the internal state of the ADC 102 or the output of the output stage 210.

The charge adjusting circuit 206 estimates the charge demand of the capacitive DAC 103 based on the internal state of the ADC 102 and generates a stabilizing charge (replenish charge) based on the internal state of the ADC 102. The charge adjusting circuit 206 injects the stabilizing charge into the reference node based on the internal state of the ADC 102 to effectively replenish the charge reservoir ($C_{ref}$), thereby stabilizing the reference voltage $V_{ref}$. Supplying the stabilizing charge to the charge reservoir based on the internal state of the ADC 102 eliminates code-dependence of a sum of the charge drawn from the charge reservoir by the capacitive DAC 103 of the ADC 102 (switched capacitor charge) and the stabilizing charge supplied to the charge reservoir during conversion.

Figure 4:
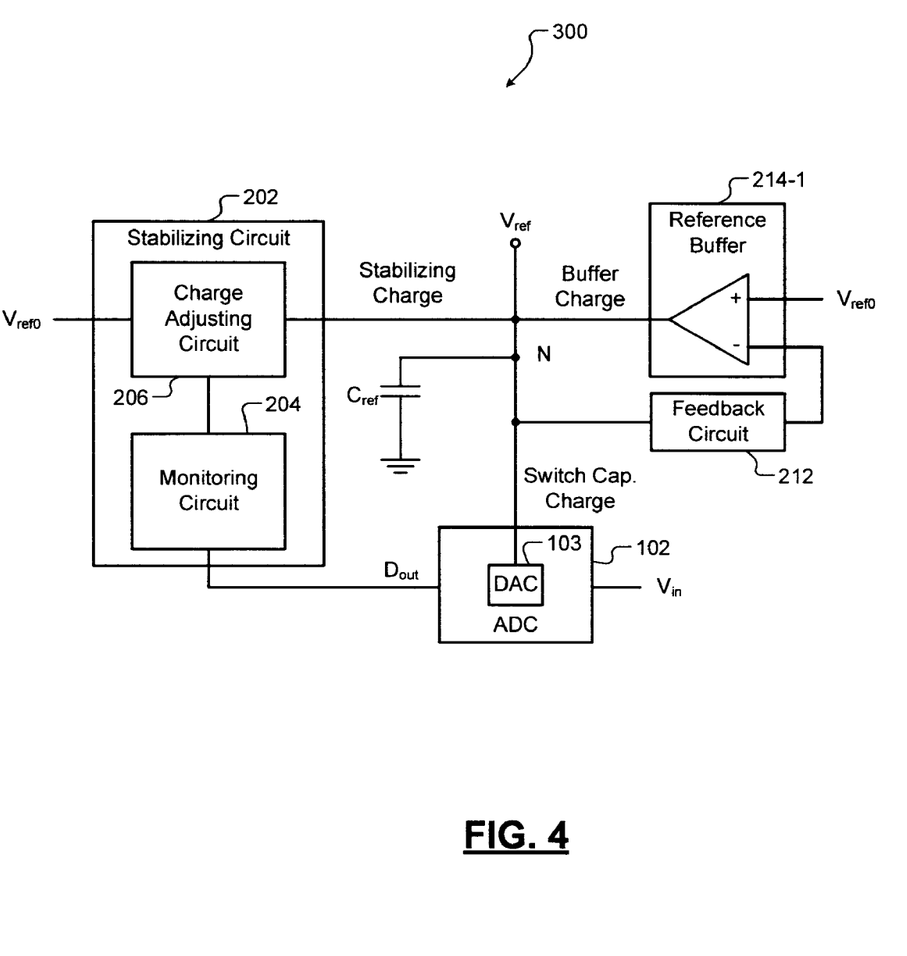
FIG. 4 depicts a system for converting an analog input into a digital output using a stabilizing circuit that injects a stabilizing charge and a reference buffer that supplies a buffer charge (residual charge) according to the present disclosure.

Referring now to FIG. 4, a system 300 for stabilizing the reference voltage when converting an analog input into a digital output according to the present disclosure is shown. The system 300 includes the ADC 102, the stabilizing circuit 202, a feedback circuit 212, and a reference buffer 214-1. The feedback circuit 212 monitors the reference voltage $V_{ref}$ and generates a feedback of the reference voltage $V_{ref}$. The reference buffer 214-1 receives the feedback and compares the feedback to a voltage $V_{ref0}$. Based on the comparison, the reference buffer 214-1 outputs a buffer charge.

If the charge adjusting circuit 206 makes a minor error in estimating the stabilizing charge, the stabilizing charge generated by the charge adjusting circuit 206 based on the internal state of the ADC 102 can be nearly equal to the charge drawn by the capacitive DAC 103 of the ADC 102 (switched capacitor charge) during conversion. Accordingly, the reference buffer 214-1 may need to supply a buffer charge that is only a residual charge necessary to correct the error, which may be positive or negative.

The reference buffer 214-1 may supply the buffer charge as needed to correct the positive or negative estimation error made by the charge adjusting circuit 206 in estimating the stabilizing charge. The buffer charge supplied by the reference buffer 214-1 can be nearly zero if the charge adjusting circuit 206 makes a minor error in estimating the stabilizing charge based on the internal state of the ADC 102. Accordingly, the reference buffer 214-1 and the feedback circuit 212 can be removed from the system 300.

Figure 5:
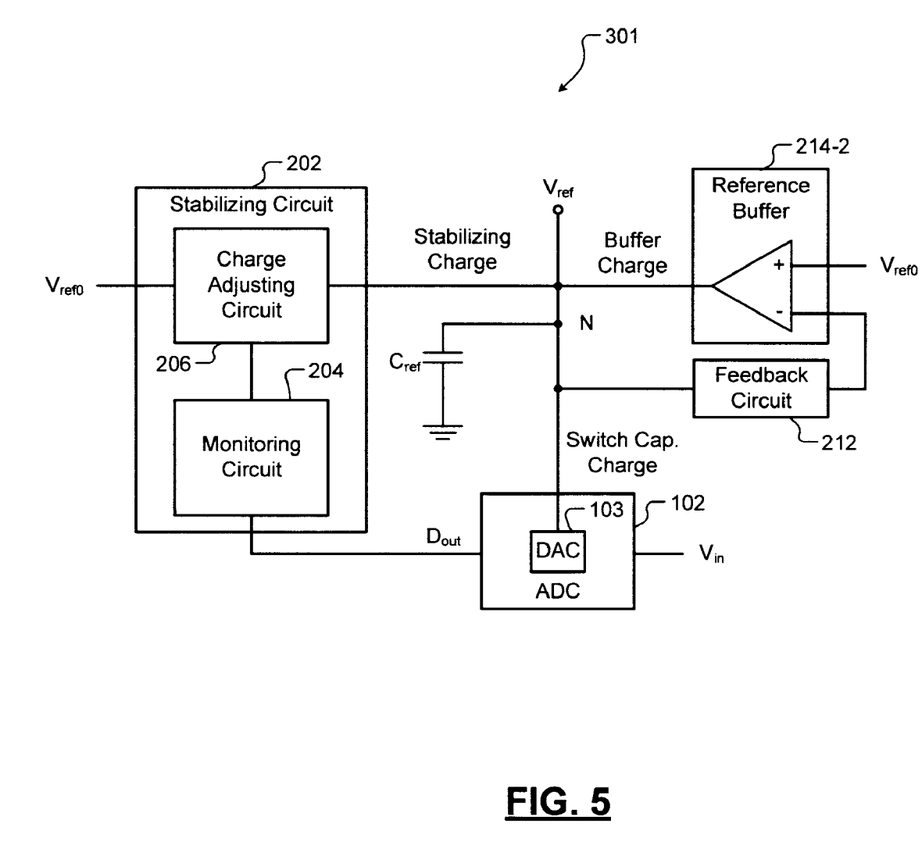
FIG. 5 depicts a system for converting an analog input into a digital output using a stabilizing circuit that draws a stabilizing charge and a reference buffer that injects a buffer charge (replenish charge) according to the present disclosure.

Referring now to FIG. 5, a system 301 for stabilizing the reference voltage when converting an analog input into a digital output according to the present disclosure is shown. The system 301 includes the ADC 102, the stabilizing circuit 202, the feedback circuit 212, and a reference buffer 214-2 according to the present disclosure. The reference buffer 214-2 supplies a buffer charge that is equal to a sum of the switched capacitor charge and the stabilizing charge as explained below.

Specifically, in some implementations, the reference voltage $V_{ref}$ may be nearly equal to the supply voltage $V_{DD}$, and injecting the stabilizing charge into the reference node can be challenging. Instead, the charge adjusting circuit 206 may draw a stabilizing charge out of the charge reservoir based on the internal state of the ADC 102 instead of injecting the stabilizing charge into the charge reservoir based on the internal state of the ADC 102. Drawing the stabilizing charge out of the charge reservoir based on the internal state of the ADC 102 eliminates code-dependence of a sum of the charge drawn from the charge reservoir by the capacitive DAC 103 of the ADC 102 (switched capacitor charge) and the stabilizing charge drawn out of the charge reservoir during conversion.

A sum of the stabilizing charge and the charge drawn by the capacitive DAC 103 of the ADC 102 (switched capacitor charge) is nearly constant during conversion. Accordingly, the output of the reference buffer 214-2 has a constant load in the form of the ADC 102 and the stabilizing circuit 202, and has to supply a buffer charge equal to the sum to replenish the charge reservoir. Consequently, the design requirements for the reference buffer 214-2 are greatly relaxed since the reference buffer 214-2 has to supply code-independent charge (or code-independent current) to replenish the charge reservoir. The reference voltage $V_{ref}$ is stabilized, and the linearity of the ADC 102 is improved.

Figure 6:
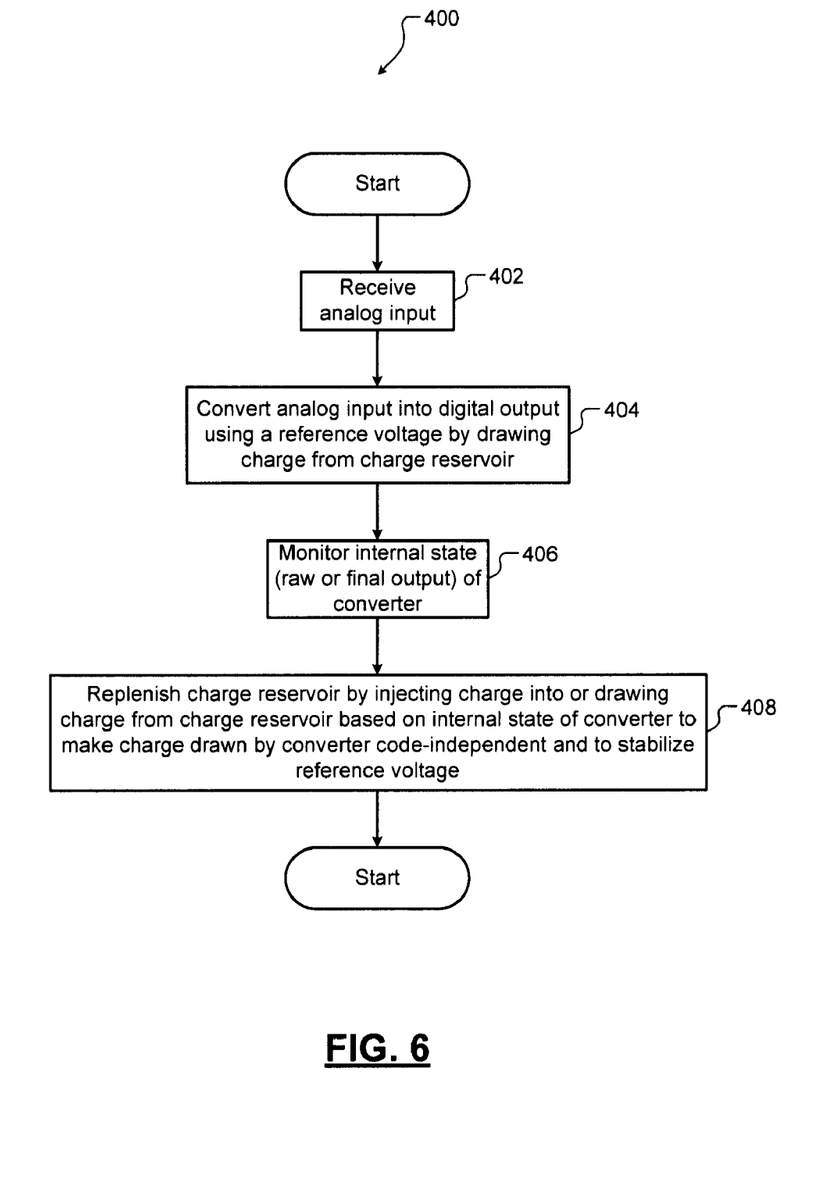
FIG. 6 depicts a flowchart of a method for stabilizing a reference voltage when converting an analog input into a digital output according to the present disclosure.

Referring now to FIG. 6, a method 400 for stabilizing the reference voltage when converting an analog input into a digital output according to the present disclosure is shown. At 402, control receives an analog input. At 404, control converts the analog input into a digital output using a reference voltage by drawing a switched capacitor charge from a charge reservoir connected to the reference voltage and ground. At 406, control monitors the internal state (raw or final output) of the converter.

At 408, control replenishes the charge reservoir that is depleted by the switched capacitor charge drawn by the converter in one of two ways. In a first way, control injects a stabilizing charge into the charge reservoir based on the internal state of the converter to make a sum of the switched capacitor charge and the stabilizing charge code independent and to stabilize the reference voltage. In a second way, control draws a stabilizing charge from the charge reservoir based on the internal state of the converter to make a sum of the switched capacitor charge and the stabilizing charge code independent and to stabilize the reference voltage. In the first way, control estimates and supplies the stabilizing charge (a replenish charge) that is nearly equal to the switched capacitor charge drawn by the converter. In the second way, control draws the stabilizing charge such that a sum of stabilizing charge and the switched capacitor charge drawn by the converter is constant during the conversion. Control supplies a buffer charge (a replenish charge) equal to the sum of the switched capacitor charge and the stabilizing charge to replenish the charge reservoir.

While the stabilization of the reference voltage is explained above with reference to ADCs and DACs, the ADCs and DACs are used only as examples of systems that use switched capacitor circuits. The stabilization of the reference voltage describe above with reference to ADCs and DACs can be used in any system that uses a switched capacitor circuit.

In general, a switched capacitor circuit draws or supplies a predictable dynamic current (charge) from or to a reference voltage node. The charge drawn or supplied is a function of an initial internal state of the switched capacitor circuit (called a first state or a current state) and a state the switched capacitor circuit transitions into (called a second state or a next state). In other words, the charge drawn or supplied by the switched capacitor circuit can be represented as a switched capacitor charge Q=f(current state, next state).

Figure 7A:
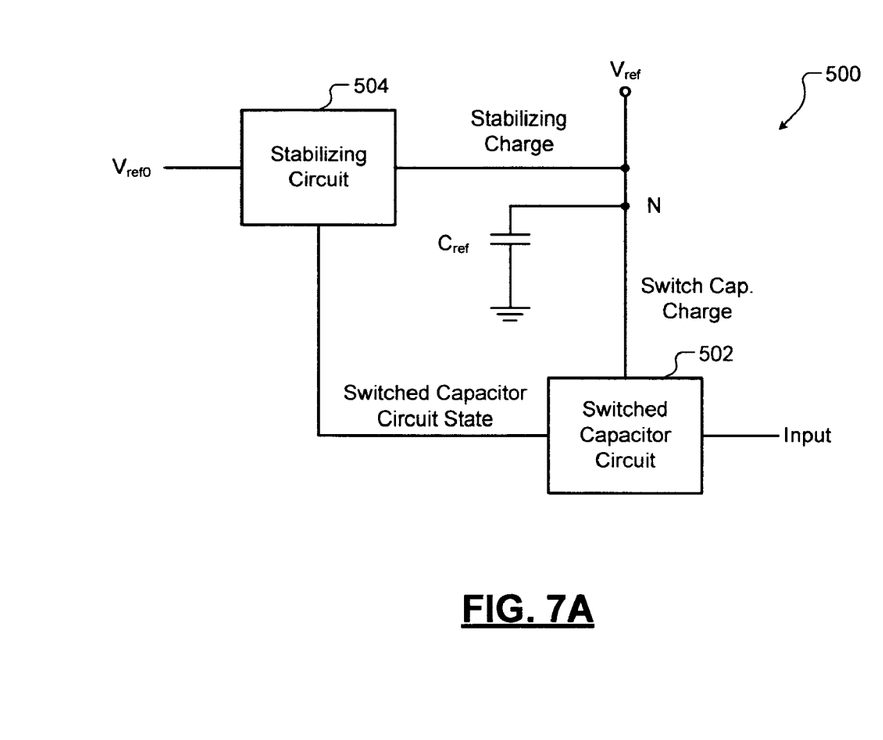
FIGS. 7A-7C depict different systems for stabilizing a reference voltage of a switched capacitor circuit according to the present disclosure.
Figure 7B:
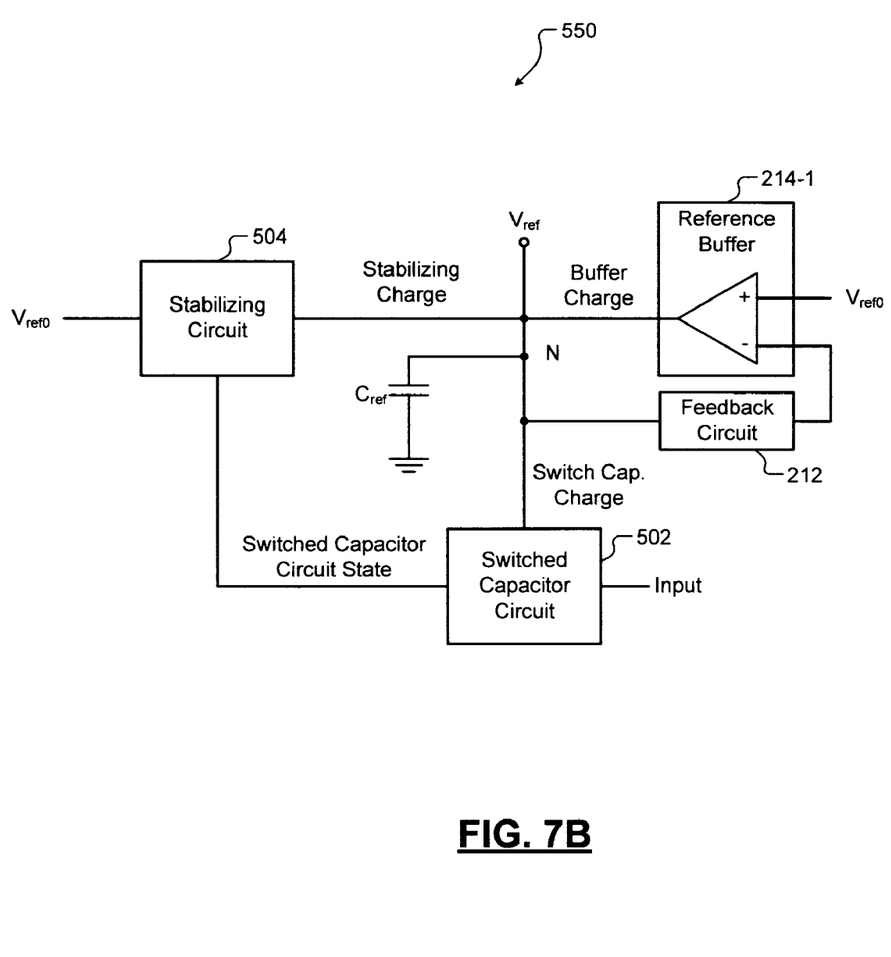
Figure 7C:
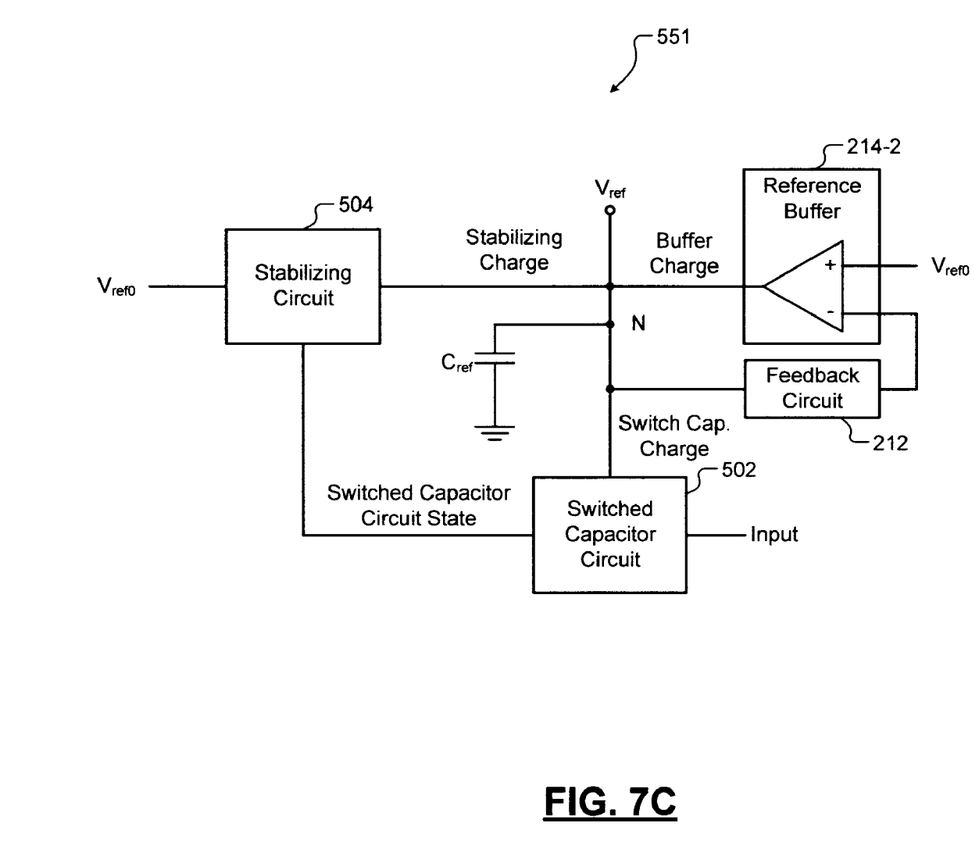

Referring now to FIGS. 7A-7C, different systems that stabilize a reference voltage used by a switched capacitor circuit according to the present disclosure are shown. In FIG. 7A, a system 500 includes a switched capacitor circuit 502 and a stabilizing circuit 504. The switched capacitor circuit 502 receives a reference voltage from a reference node N. The switched capacitor circuit 502 transitions from a first state to a second state by drawing or supplying a charge (switched capacitor charge) from or to the reference node. The first state may or may not be based on an input to the switched capacitor circuit 502. The input to the switched capacitor circuit 502 may be analog, digital, or a combination of both. The second state is a function of the first state, the input, or a combination of both. The switched capacitor circuit 502 may draw or supply the switched capacitor charge from or to the reference node dynamically (i.e., at discrete times). The switched capacitor charge drawn or supplied by the switched capacitor circuit 502 is a function of the first and second states of the switched capacitor circuit 502.

The stabilizing circuit 504 stabilizes the reference voltage by supplying or drawing a charge (stabilizing charge) to the reference node based on the first state and the second state of the switched capacitor circuit 502. The reference capacitance $C_{REF}$ bridges the time difference between the delivery of the switched capacitor charge and the stabilizing charge. The reference capacitance $C_{REF}$ sources/draws the switched capacitor charge drawn/sourced by the switched capacitor circuit 502, and then some time later the stabilizing circuit 504 sources/draws the stabilizing charge that is equal and opposite to the switched capacitor charge drawn/sourced from/to the reference capacitance $C_{REF}$. The switched capacitor charge and the stabilizing charge are a function of the first and second states of the switched capacitor circuit 502. A sum of the switched capacitor charge and the stabilizing charge is independent of the first and second states of the switched capacitor circuit 502.

In FIG. 7B, a system 550 includes the switched capacitor circuit 502, the stabilizing circuit 504, the feedback circuit 212, and the reference buffer 214-1. The switched capacitor circuit 502 and the stabilizing circuit 504 operate as described with reference to FIG. 7A. The feedback circuit 212 provides feedback of the reference voltage. Based on the feedback, the reference buffer 214-1 supplies a buffer charge to the node to compensate for a positive or negative error in estimation of the second charge.

In FIG. 7C, a system 551 includes the switched capacitor circuit 502, the stabilizing circuit 504, the feedback circuit 212, and the reference buffer 214-2. The switched capacitor circuit 502 operates as described with reference to FIG. 7A. The stabilizing circuit 504 stabilizes the reference voltage by supplying or drawing a stabilizing charge to or from the reference node based on the first state and the second state of the switched capacitor circuit 502. The switched capacitor charge and the stabilizing charge are a function of the first and second states of the switched capacitor circuit 502. A sum of the switched capacitor charge and the stabilizing charge is independent of the first and second states of the switched capacitor circuit 502.

The feedback circuit 212 provides feedback of the reference voltage. Based on the feedback, the reference buffer 214-2 supplies a buffer charge to the reference node. The buffer charge is independent of the first state and the second state of the switched capacitor circuit 502 and replenishes any charge in the reference capacitance $C_{REF}$ that is depleted due to a sum of the switched capacitor charge and the stabilizing charge drawn from the reference capacitance $C_{REF}$. The buffer charge is equal to a sum of the switched capacitor charge and the stabilizing charge.

As used herein, all the charges may be considered instantaneous or averaged over a period of time. The buffer charge may be a constant current flow. The switched capacitor charge and the stabilizing charge may be dynamic (instantaneous) charges. The sum of the charges flowing into the reference capacitance $C_{REF}$ over a period of time is zero. The charge injections and withdrawals (stabilizing and buffer charges) need not be synchronous with the switched capacitor charge drawn or supplied by the switched capacitor circuit 502 from or to the reference node. The charge injections and withdrawals (stabilizing and buffer charges) need not occur at the same frequency as that of the switched capacitor charge drawn or supplied by the switched capacitor circuit 502 from or to the reference node. For example, the stabilizing and buffer charges could be applied at $1/N^{th}$ the frequency of the switched capacitor charge, where N is greater than 1.

Figure 8:
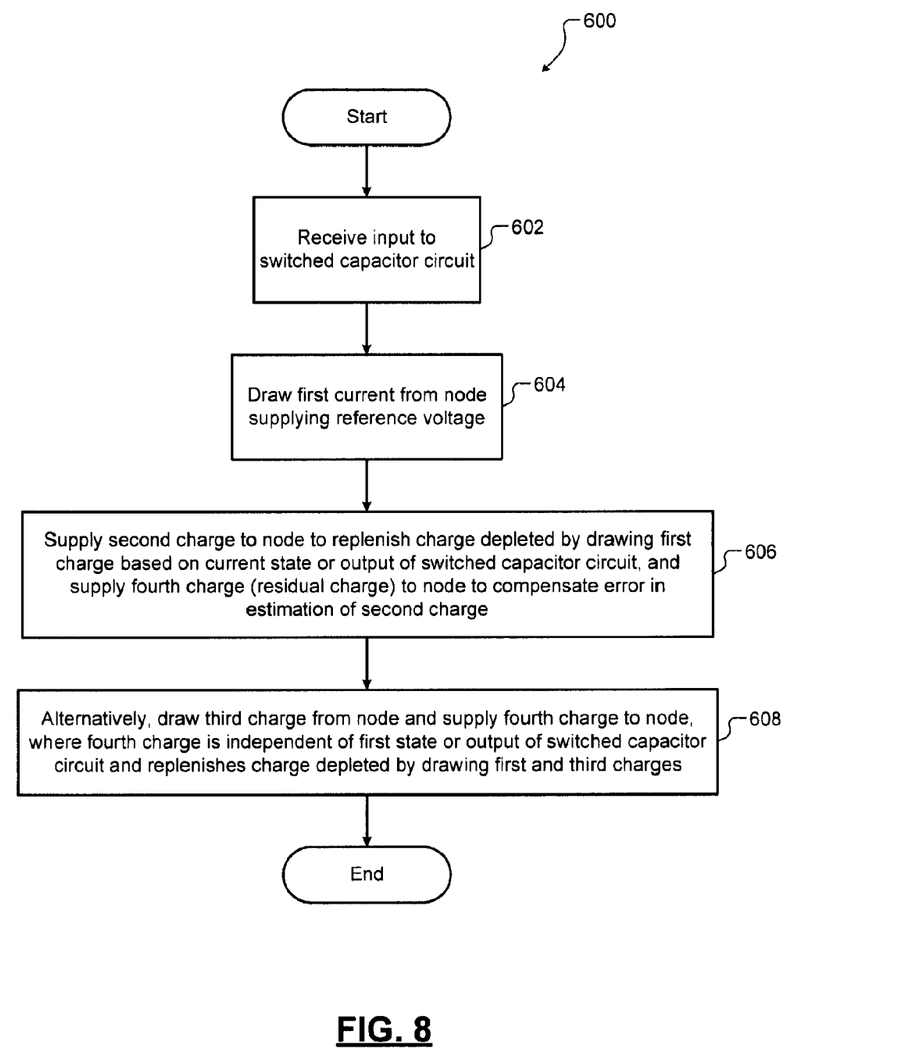
FIG. 8 depicts a flowchart of a method for stabilizing a reference voltage of a switched capacitor circuit according to the present disclosure.

Referring now to FIG. 8, the method 600 for stabilizing a reference voltage of a switched capacitor circuit shown. At 602, the switched capacitor circuit receives an input. The input may be analog, digital, or a combination of both. A first state of the switched capacitor circuit may or may not be a function of the input. At 604, the switched capacitor circuit transitions from the first state to a second state by drawing or supplying a switched capacitor charge from or to a reference node supplying the reference voltage. The second state is a function of the first state, the input, or a combination of both. At 606, a stabilizing circuit supplies or draws a stabilizing charge to or from the reference node to replenish charge depleted from a charge reservoir connected to the node due to the switched capacitor circuit drawing or supplying the switched capacitor charge from or to the reference node. The stabilizing charge is estimated based on the first and second states of the switched capacitor circuit. A reference buffer supplies a buffer charge to the reference node to compensate any positive or negative errors in the estimation of the stabilizing charge.

At 608, alternatively (i.e., instead of 606), the stabilizing circuit draws or supplies a stabilizing charge from or to the reference node, and the reference buffer supplies a buffer charge to the reference node. The buffer charge is independent of the first state and the second state of the switched capacitor circuit. The buffer charge replenishes charge depleted from the charge reservoir due to the switched capacitor circuit drawing the switched capacitor charge and the stabilizing circuit drawing the stabilizing charge from the reference node. The buffer charge is equal to a sum of the switched capacitor charge and the stabilizing charge.

The systems 500, 550, or 551, the method 600 described above and the switched capacitor circuits 502 and 503 described below with references to FIGS. 9A and 9B can be used in any signal processing or data processing system that uses a switched capacitor circuit. For example, the systems 500, 550, or 551, the method 600, and the switched capacitor circuits 502 and 503 can be used in a capacitive DAC or in a cyclic or algorithmic ADC such as a SAR ADC or a pipelined ADC as explained in detail above.

Figure 9A:
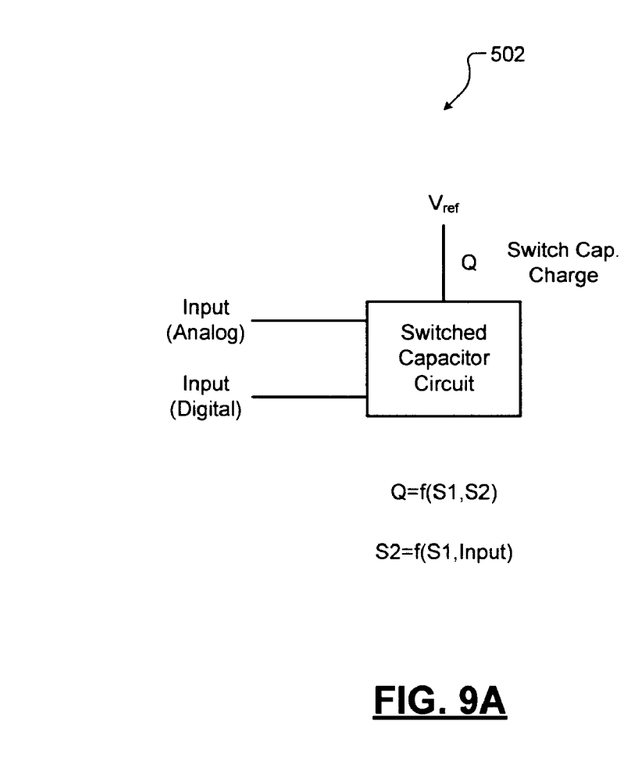
FIG. 9A depicts a switched capacitor circuit that receives an analog input, a digital input, or both according to the present disclosure.

Referring now to FIG. 9A, the switched capacitor circuit 502 according to the present disclosure may receive an analog input, a digital input, or a combination of both. The switched capacitor circuit 502 may transition from a first state to a second state by drawing or supplying a switched capacitor charge Q from or to a reference node to which a source supplies a reference voltage. The switched capacitor charge Q is a function of the first and second states. The second state is a function of the first state, one or both inputs to the switched capacitor circuit 502, or a combination of both.

Figure 9B:
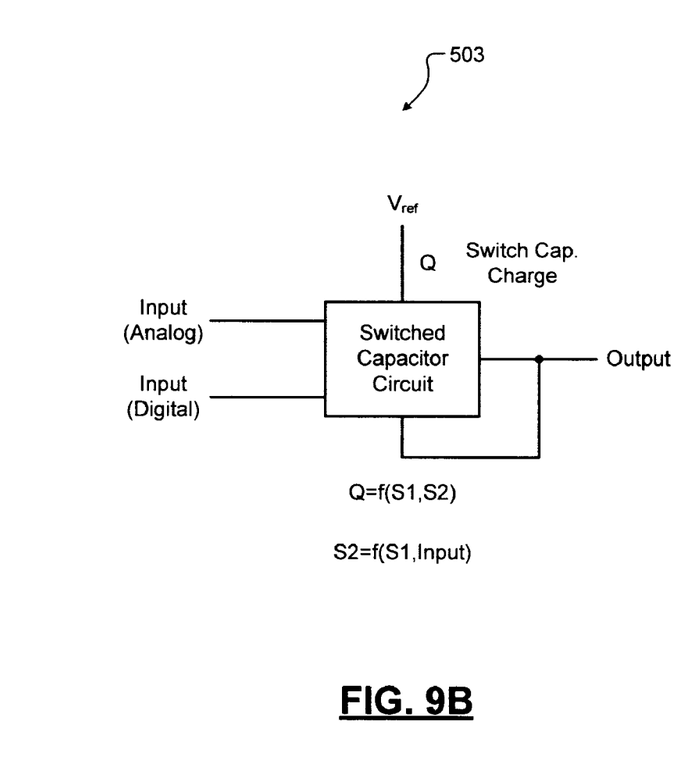

Referring now to FIG. 9B, a switched capacitor circuit 503 according to the present disclosure may receive an analog input, a digital input, or a combination of both. The switched capacitor circuit 503 may transition from a first state to a second state by drawing or supplying a switched capacitor charge Q from or to a reference node to which a source supplies a reference voltage. The switched capacitor charge Q is a function of the first and second states. The second state is a function of the first state, one or both inputs to the switched capacitor circuit 503, or a combination of both. The switched capacitor circuit 503 may generate an output that is a function of the reference voltage, the first and second states, one or more of the inputs, or any combination thereof. The output may be fed back to the switched capacitor circuit 503.

The switched capacitor circuit, the stabilizing circuit, and other elements identified by reference numeral are shown as separate components throughout the present disclosure. It should be understood, however, that one or more of these circuits and elements may be integrated into a single circuit or element. Alternatively, one or more of these circuits and elements may be implemented by a plurality of circuits or elements.

Figure 10:
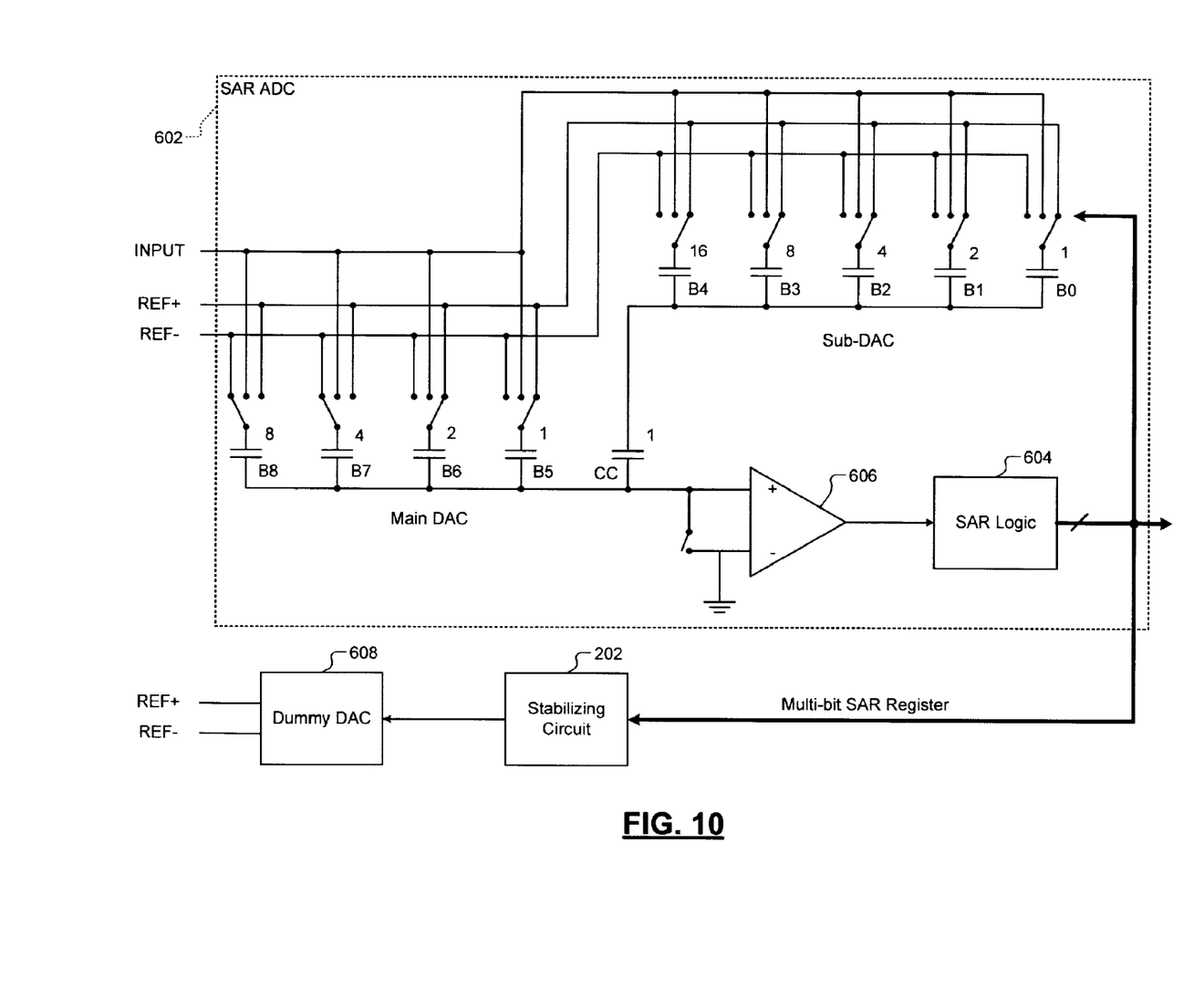
FIG. 10 depicts a successive-approximation-register (SAR) ADC as an example of a circuit that uses the system for stabilizing a reference voltage used by the SAR ADC according to the present disclosure.

Referring now to FIG. 10, a SAR ADC 602 is shown as an example of a circuit that uses the system according to the present disclosure to stabilize the reference voltage of the SAR ADC 602. The SAR ADC 602 comprises a capacitive DAC including a main DAC and a sub-DAC, a SAR logic 604, and a comparator 606. The SAR ADC 602 uses reference voltages $V_{REF+}$ and $V_{REF-}$ (hereinafter the reference) to convert input data. The SAR logic 604 outputs multi-bit SAR register to the stabilizing circuit 202. During data conversion, the stabilizing circuit 202 monitors the internal state of the SAR ADC 602 and calculates or looks up (e.g., from a ROM) the amount of charge that will be used in the next step of the data conversion. A dummy DAC 608 is used to balance the load on the reference and to keep the load on the reference constant. The dummy DAC 608 is used to provide an additional load to the reference so that all codes have the same load on the reference. The dummy DAC 608 adds an additional load to the reference so that the combined load on the reference becomes code independent (i.e., the reference does not vary depending on the code being converted by the SAR ADC 602). Code dependent variations in the reference are minimized by keeping the load on the reference constant by adding the additional load in the form of the dummy DAC 608 that is designed to keep the sum constant.

Throughout the present disclosure, the first and second states of the switched capacitor circuit are used for example only. In general, a state of the switched capacitor circuit can be a function of one or more prior states of the switched capacitor circuit. Further, the prior states, of which a state is a function, may not be in any particular order or sequence. In some implementations, the stabilizing circuit may supply or draw charge at a frequency irrespective of a frequency at which the switched capacitor circuit switches states. In some implementations, the stabilizing circuit may supply or draw charge at a frequency at which the switched capacitor circuit switches states. In some implementations, the stabilizing circuit may supply or draw charge at a lower (or higher) frequency than the frequency at which the switched capacitor circuit switches states. For example, the stabilizing circuit may supply or draw charge at every Nth state of the switched capacitor circuit, where N is an integer greater than or equal to 1. Further, at the Nth state, the stabilizing circuit may calculate the amount of charge to be supplied or drawn based on one or more prior states. For example, at the Nth state, the stabilizing circuit may calculate the amount of charge to be supplied or drawn cumulatively based on one or more prior states. That is, at the Nth state, the amount of charge to be supplied or drawn may be a sum of the charges that would have been supplied or drawn at one or more prior states. Alternatively, at the Nth state, the stabilizing circuit may calculate the amount of charge to be supplied or drawn without regard to the charges that would have been supplied or drawn at one or more prior states. Additional variations and modifications will become apparent to ordinarily skilled artisans and are contemplated.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

What is claimed is:

1. A system comprising:
    a switched capacitor circuit that has a first state, wherein the first state is a function of an input of the switched capacitor circuit; that receives a reference voltage from a reference node; that transitions from the first state to a second state in response to a change in the input of the switched capacitor circuit, wherein the second state is a function of the first state or the input of the switched capacitor circuit; and that draws or supplies a switched capacitor charge from or to the reference node in response to transitioning from the first state to the second state;
    a stabilizing circuit that stabilizes the reference voltage by supplying or drawing a stabilizing charge to or from the reference node based on the first and second states of the switched capacitor circuit;
    a feedback circuit that is connected to the reference node and that generates a feedback of the reference voltage; and
    a buffer that receives the feedback and a first voltage and that supplies a buffer charge to the reference node,
    wherein the buffer charge compensates for a positive or negative error in estimation of the stabilizing charge.

2. The system of claim 1 wherein the switched capacitor charge and the stabilizing charge are a function of the first and second states.

3. The system of claim 1 wherein a sum of the switched capacitor charge and the stabilizing charge is independent of the first and second states.

4. The system of claim 1 wherein:
    the buffer charge is independent of the first and second states and replenishes any charge in a capacitance connected to the reference node that is depleted due to a sum of the switched capacitor charge and the stabilizing charge drawn from the capacitance.

5. The system of claim 1 wherein:
    the buffer charge is equal to a sum of the switched capacitor charge and the stabilizing charge.

6. A digital-to-analog converter comprising the system of claim 1.

7. An analog-to-digital converter comprising the system of claim 1.

8. A method comprising:
    receiving a reference voltage at a switched capacitor circuit from a reference node, wherein the switched capacitor circuit has a first state, and wherein the first state is a function of an input of the switched capacitor circuit;
    transitioning from the first state to a second state in response to a change in the input of the switched capacitor circuit, wherein the second state is a function of the first state or the input of the switched capacitor circuit;
    drawing or supplying a switched capacitor charge from or to the reference node in response to the switched capacitor circuit transitioning from the first state to the second state;
    stabilizing the reference voltage by supplying or drawing a stabilizing charge from or to the reference node based on the first and second states of the switched capacitor circuit;
    generating a feedback of the reference voltage;
    supplying a buffer charge to the reference node based on the feedback and a first voltage; and
    compensating for a positive or negative error in estimation of the stabilizing charge using the buffer charge.

9. The method of claim 8 wherein the switched capacitor charge and the stabilizing charge are a function of the first and second states.

10. The method of claim 8 wherein a sum of the switched capacitor charge and the stabilizing charge is independent of the first and second states.

11. The method of claim 8 wherein the buffer charge is independent of the first and second states, the method further comprising:
    replenishing using the buffer charge any charge in a capacitance connected to the reference node that is depleted due to a sum of the switched capacitor charge and the stabilizing charge drawn from the capacitance.

12. The method of claim 8 wherein:
    the buffer charge is equal to a sum of the switched capacitor charge and the stabilizing charge.

* * * * *